(12) United States Patent
Miyahara

(10) Patent No.: US 8,738,312 B2
(45) Date of Patent: May 27, 2014

(54) PHASE MEASURING DEVICE AND FREQUENCY MEASURING DEVICE

(75) Inventor: Kazunori Miyahara, Nishinomiya (JP)

(73) Assignee: Furuno Electric Co., Ltd., Nishinomiya (JP)

( * ) Notice: Subject to any disclaimer, the term of this patent is extended or adjusted under 35 U.S.C. 154(b) by 378 days.

(21) Appl. No.: 13/201,648

(22) PCT Filed: Feb. 26, 2010

(86) PCT No.: PCT/JP2010/053144
§ 371 (c)(1),
(2), (4) Date: Aug. 16, 2011

(87) PCT Pub. No.: WO2010/098460
PCT Pub. Date: Sep. 2, 2010

(65) Prior Publication Data
US 2011/0301895 A1 Dec. 8, 2011

(30) Foreign Application Priority Data
Feb. 27, 2009 (JP) ................. 2009-046023

(51) Int. Cl.
*G06F 19/00* (2011.01)
*H04L 7/00* (2006.01)

(52) U.S. Cl.
USPC ............................ 702/72; 375/355

(58) Field of Classification Search
USPC ............... 702/72, 57, 75, 79, 81, 84, 89, 106, 702/127, 176, 182, 189; 375/226, 354–355, 375/360, 362, 364, 375; 327/2–3, 7, 39–40, 327/42, 47, 72, 74, 100, 141, 144, 153, 159, 327/161–163, 231–236, 263, 269, 291
See application file for complete search history.

(56) References Cited

U.S. PATENT DOCUMENTS

| 5,796,682 A | 8/1998 | Swapp |
| 2009/0216488 A1 | 8/2009 | Baba et al. |

FOREIGN PATENT DOCUMENTS

| CN | 1892235 A | 1/2007 |
| JP | 61-28070 U | 2/1986 |

(Continued)

OTHER PUBLICATIONS

Ramakrishnan et al., A Wide-Range, High-Resolution, Compact, CMOS Time to Digital Converter, 2006, Proceedings of the 19th International Conference on VLSI Design, 6 pp.*

(Continued)

*Primary Examiner* — Toan Le
(74) *Attorney, Agent, or Firm* — Birch, Stewart, Kolasch & Birch, LLP.

(57) ABSTRACT

This disclosure provides a phase measuring device that can measure phase differences with high precision using the digital circuits. A phase measuring device includes a buffer delay measuring circuit and a phase difference measuring circuit which use a TDC, respectively, and a phase difference calculator. The buffer delay measuring circuit generates delay measurement data indicating a delay amount $\tau_B$ between the buffers of the TDCs based on a highly precise clock signal and a sampling reference signal. The phase difference measuring circuit generates a number data row indicating a phase difference between measuring signals SS(A) and SS(B), and first and second phase difference measuring data Ds(A) and Ds(B), using the clock signal. The phase difference calculator calculates the phase difference using numbers of state data $N_B(A)$ and $N_B(B)$ based on the first and second phase difference measuring data Ds(A) and Ds(B), the number data row, and the highly precise delay amount $\tau_B$ obtained from the delay measurement data.

4 Claims, 5 Drawing Sheets

(56) References Cited

FOREIGN PATENT DOCUMENTS

| | | |
|---|---|---|
| JP | 7-229979 A | 8/1995 |
| JP | 10-54887 A | 2/1998 |
| JP | 10-111369 A | 4/1998 |
| JP | 2000-286698 A | 10/2000 |
| JP | 2001-74824 A | 3/2001 |
| JP | 2002-334434 A | 11/2002 |
| JP | 2005-134215 A | 5/2005 |
| JP | 2005-233975 A | 9/2005 |
| JP | 2007-248142 A | 9/2007 |
| KR | 10-2009-0115864 A | 11/2009 |
| WO | WO 2007-093221 A1 | 8/2007 |
| WO | WO 2008/108374 A1 | 9/2008 |

OTHER PUBLICATIONS

Chinese Office Action issued in Chinese Application No. 201080009475.7 on May 23, 2013.
Japanese Office Action issued in Japanese Application No. 2011-501675 on Jun. 26, 2013.
International Search Report, PCT/JP2010/053144, May 25, 2010.
Katano et al. "Time: Measuring Technique of Time and Frequency", Measurement and Control, vol. 44, No. 10, October Issue, 2005, pp. 675-680.

* cited by examiner

PHASE MEASURING DEVICE AND FREQUENCY MEASURING DEVICE

TECHNICAL FIELD

The present invention relates to a phase measuring device that measures a phase difference of two measuring signals, and a frequency measuring device that measures frequencies of the measuring signal.

BACKGROUND OF THE INVENTION

Now, many methods of converting values of time and frequency into electric signals and measuring them are used for the measurement of the time and frequency. In such electric measurement, the times to be measured is calculated, using clock signals which are references of the measurement, by detecting the number of the clock signals for one cycle. However, although wavelengths of the clock signals may be shortened in order to make the measurement times highly precise, there is a realistic limit also in the wavelengths of the generable clock signals. For this reason, it is very effective to make them highly precise how the fractional parts which are less than one cycle of the clock signals are measured. Therefore, for example in Nonpatent Document 1, the fractional parts are measured by converting them into voltage values using a capacitor.

RELATED ART DOCUMENT(S)

[Nonpatent Document 1] "*Time: Measuring Technique of Time and Frequency*," Kazuya Katano, Yuji Yamaguchi, Measurement and Control, Vol. 44, No. 10, October Issue, 2005

SUMMARY OF THE INVENTION

Problem(s) to be Solved by the Invention

However, by the method of Nonpatent Document 1, analog circuitry, such as a time-voltage conversion circuit and an ADC circuit (analog-to-digital conversion circuit), serves as an essential constituent. Therefore, errors which are easy to be produced because of being the analog circuitry, such as noise, offset, and temperature changes, tend to be contained in the measuring results. Moreover, since various kinds of analog circuitry are needed, down-sizing and cost-reduction are difficult.

Therefore, a purpose of the present invention is to achieve a phase measuring device that can measure a phase difference between times (i.e., two signals) with high precision using a digital circuit. Moreover, another purpose of the present invention is to achieve a frequency measuring device that can measure frequencies of target signals with high precision by a similar circuit configuration as the phase measuring device. Furthermore, a purpose of the present invention is to achieve a reference signal generating device that can generate highly precise reference signals, and an abnormality detecting device that detects abnormalities of the reference signal generating device, by using the phase measuring device.

Means for Solving the Problem

A phase measuring device of one aspect of the present invention includes a buffer delay amount measuring circuit, a phase difference measuring circuit, and a phase difference calculator.

The buffer delay amount measuring circuit includes a plurality of buffers. Each of the plurality of buffers is inputted with a clock signal, that are synchronized with a reference signal calculated by positioning calculation, at different timings shifted by a fixed delay time, respectively, and is simultaneously inputted with a sampling reference signal of a lower frequency than the clock signals. Each of the buffers generates state data according to a level of the clock signal at a transition timing of the sampling reference signal. The buffer delay amount measuring circuit outputs delay measurement data comprised of a group of these state data.

The phase difference measuring circuit includes a first partial phase difference measuring circuit and a second partial phase difference measuring circuit. The first partial phase difference measuring circuit includes a plurality of buffers, similar to the buffer delay amount measuring circuit. Each of the plurality of buffers is inputted with a first measuring signal among the first measuring signal and a second measuring signal that produce a phase difference therebetween to be measured, and is inputted with the clock signal at mutually different timings by the delay amount. Each of the buffers respectively generates state data according to the level of the clock signal at a transition timing of the first measuring signal. The first partial phase difference measuring circuit outputs first phase difference measurement data comprised of a group of state data from the plurality of buffers.

The second partial phase difference measuring circuit includes a plurality of buffers, similar to the buffer delay amount measuring circuit. Each of the plurality of buffers is inputted with the second measuring signal which produces a phase difference to be measured, and is inputted with the clock signal at mutually different timings by the delay amount. Each of the buffers generates state data according to the level of the clock signal at a transition timing of the second measuring signal. The second phase difference measurement circuit outputs second phase difference measurement data comprised of a group of the state data from the plurality of buffers.

The phase difference calculator calculates the delay amount between the buffers based on the delay measurement data, and calculates the phase difference based on a difference value of the transition timings and the delay amounts of the clock signals of the first phase difference measurement data and the second phase difference measurement data.

With this configuration, the phase difference is measured using what is called a "TDC" (Time to Digital Converter) provided with a plurality of buffers.

The buffer delay amount measuring circuit includes a TDC provided with the plurality of buffers (flip-flop), and sequentially gives the same clock signals with the cumulative delay amount (time lags) to each buffer of the TDC. Here, since the clock signal synchronizes with the highly precise reference signal such as 1PPS of GPS, the delay amount calculated from the clock signal becomes highly precise, similar to the accuracy of the reference signal. With this, in the buffer delay amount measuring circuit, the sampling reference signal of the long cycle is simultaneously given to each buffer. At the transition timing of the sampling reference signal, there are buffer(s) where the clock signal is in a high level and buffer(s) where the clock signal is in a low level, and to each buffer, the state data of, for example, "1" or "0" according to the level is outputted. Here, the number of state data (refer to FIG. 2), which exist between the transition timings of the adjacent state data from "1" to "0" in the delay measurement data comprised of the state data sequence of "1" and "0," depends on the delay amount of the buffers and the frequency (cycle) of the clock signal.

The phase difference measuring circuit has one TDC for each of the first partial phase difference measuring circuit and the second partial phase difference measuring circuit, and the same clock signal as the buffer delay measuring circuit is given to each buffer of each TDC. Here, since the clock signal also synchronizes with the highly precise reference signal such as 1PPS of GPS, the delay amount calculated from the clock signal also becomes highly precise, similar to the accuracy of the reference signal. Moreover, the first partial phase difference measuring circuit is inputted with the first measuring signal, and the second partial phase difference measuring circuit is inputted with the second measuring signal. Here, according to a principle similar to the buffer delay measuring circuit, the state data of each buffer at the transition timing of the first measuring signal are different in the first partial phase difference measuring circuit, and the first phase difference measurement data comprised of the state data group is outputted. Moreover, according to a similar principle, also in the second partial phase difference measuring circuit, the state data of each buffer at the transition timing of the second measuring signal are different, and the second phase difference measurement data comprised of the state data group is outputted. The number of state data up to a specific transition timing of the first phase difference measurement data and the second phase difference measurement data (a timing at which the state data of FIG. 4 transitions from "1" to "0") is dependent on a time lag between the transition timing of the clock signal and the transition timing of the first measuring signal or the second measuring signal.

The phase difference calculator gives (multiplies) the delay amount between the buffers obtained from the delay measurement data to (by) the number of state data up to the specific transition timing of the first phase difference measurement data and the second phase difference measurement data to obtain the time lag between the transition timing of the clock signal and the transition timing of the first measuring signal or the second measuring signal. Thus, since the time lag is obtained, the accurate delay amount between the buffers can be obtained and highly precise phase difference measurement is now possible.

Moreover, the phase difference measuring circuit of the phase measuring device of the present invention may include a third partial phase difference measuring circuit for giving a start timing and an end timing of measuring the number of clock signals per one cycle as a first measuring signal and a second measuring signal, respectively, to calculate the number of clock signals per one cycle contained within the phase difference. The phase difference calculator may calculate the phase difference also containing a time length according to the number of clock signals per one cycle.

With this configuration, when the phase difference is more than one cycle of the clock signal and has a time length from which this one cycle can be counted, a part of the phase difference can be calculated using one cycle of the clock signal as a resolution, without measuring all data only of the delay amount of the buffer. In addition, a fractional part which is less than one cycle of the clock signal is calculated by the above method using the delay amount between the buffers of the TDC. Thereby, when the phase difference is longer than one cycle of the clock signal as described above, the number of buffers of each TDC can be reduced.

Moreover, a frequency measuring device of another aspect of the present invention includes a buffer delay amount measuring circuit, a frequency measuring circuit, and a frequency calculator. The buffer delay amount measuring circuit has the same configuration as described above, and outputs delay measurement data. The frequency measuring circuit includes a plurality of buffers. Each of the buffers of the frequency measuring circuit is inputted with a third measuring signal at different timings shifted by a fixed delay time, respectively, and is simultaneously inputted with a sampling reference signal of a lower frequency than the third measuring signal. Each buffer generates state data according to a level of the third measuring signal at a transition timing of the sampling reference signal, and the frequency measuring circuit outputs the frequency measurement data comprised of a group of the state data. The frequency calculator calculates the delay amount between the buffers based on the delay measurement data, and calculates a frequency or a cycle of the third measuring signal based on the frequency measurement data by using the delay amount.

With this configuration, the frequency and the cycle of the measuring to signal are calculated, instead of the phase difference (time lag) described above. The buffer delay measuring circuit is the same as the phase difference measuring device described above, and outputs the delay measurement data comprised of a state data sequence depending on the delay amount of the buffer and the frequency (cycle) of the clock signal.

The frequency measuring circuit is a circuit provided with one TDC of which configuration is the same as the buffer delay circuit, and it gives the delay amount to the measuring signal, instead of the clock signal to input it into each buffer. Thereby, the state data sequence of the frequency measurement data outputted is dependent on the frequency (cycle) of the measuring signal.

The frequency calculator gives (multiplies) the delay amount obtained from the delay measurement data to (by) the number of state data between the transition timings of the frequency measurement data, and can detect one cycle of the measuring signal, thereby obtaining the frequency by the one cycle. Under the present circumstances, a highly precise measurement of the cycle and the frequency is now possible because the delay amount which is shorter than the cycle of the clock signal serves as the resolution.

Moreover, a frequency measuring device of another aspect of the present invention includes a measuring circuit and a frequency calculator. The measuring circuit includes a plurality of buffers. Each of the buffers is inputted with either one of clock signals and third measuring signals, that are synchronized with a reference signal calculated by positioning calculation, at different timings shifted by a fixed delay time, respectively, and is simultaneously inputted with a sampling reference signal of a lower frequency than the clock signals and the third measuring signals. The measuring circuit outputs delay measurement data comprised of a group of the state data according to levels of the clock signals at a transition timing of the sampling reference signal. Whereas, the measuring outputs frequency measurement data comprised of a group of the state data according to levels of the third measuring signals at the transition timing of the sampling reference signal. The frequency calculator calculates the delay amount between the buffers based on the delay measurement data. The frequency calculator calculates a frequency or a cycle of the third measuring signals based on the frequency measurement data and the delay amount.

This configuration focuses on that the buffer delay measuring circuit and the frequency measuring circuit described above have the same structure but have a difference of the inputted signal being the clock signal or the measuring signal, and the configuration includes the measuring circuit. The delay measurement data is outputted when the clock signals are inputted, whereas the frequency measurement data is outputted when the measuring signals are inputted. Thereby, the necessary number of TDCs becomes one, and the circuit scale is downsized.

Effect of the Invention

According to the aspects of the present invention, the measuring device that performs highly precise phase measurement and frequency measurement only with digital processing can be achieved, without using analog circuitry.

BEST MORE FOR CARRYING OUT THE INVENTION

Figure 1:
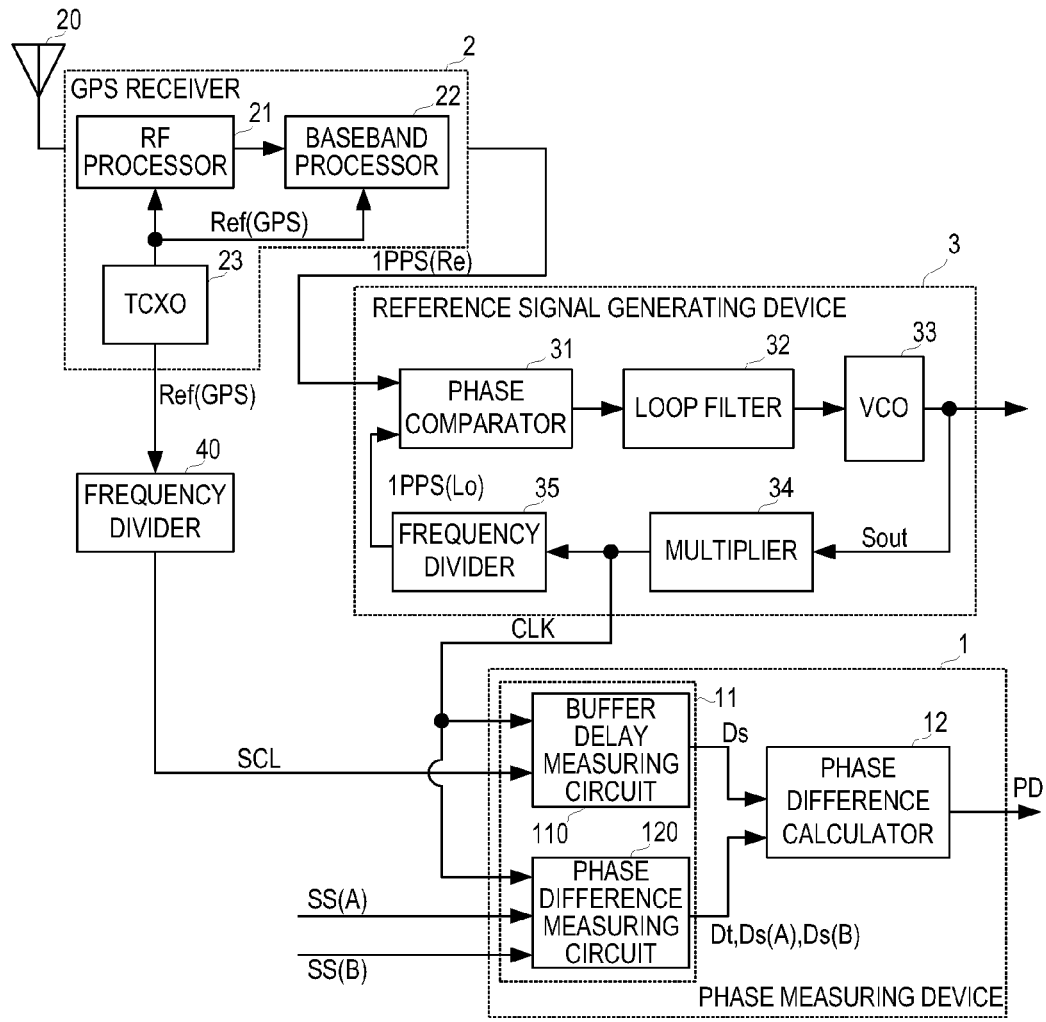
FIG. 1 is a block diagram showing primary configurations of a phase measuring device and each device that gives various kinds of signals to the phase measuring device, according to a first embodiment of the present invention.

A phase measuring device according to a first embodiment of the present invention is described with reference to the accompanying drawings. FIG. 1 is a block diagram showing a primary configuration of the phase measuring device of this embodiment and each device that gives various kinds of signals to the phase measuring device. Note that, although the following description shows an example in which GPS is used, other GNSSs may also be used, and, alternatively, such a configuration may also be possible, in which a sampling reference signal and a reference signal are given from external device(s) to a phase measuring device 1 and a reference signal generating device 3.

First, each device of a phase measurement system including the phase measuring device 1 of this embodiment is generally described.

A GPS receiver 2 includes an RF processor 21, a baseband processor 22, and a TCXO (crystal oscillator) 23. The TCXO 23 generates a GPS reference signal Ref(GPS) for demodulation and gives it to the RF processor 21 and the baseband processor 22, as well as to a frequency divider 40. The RF processor 21 is connected with a GPS antenna 20 and receives GPS positioning signals. The RF processor 21 uses the GPS reference signal Ref(GPS) to down-convert the received signals, and gives them to the baseband processor 22. The baseband processor 22 demodulates the baseband signals to perform positioning calculation, and generates 1PPS(Re) corresponding to the reference signal of the present invention to give it to the reference signal generating device 3.

The reference signal generating device 3 includes a phase comparator 31, a loop filter 32, a VCO (Voltage Controlled Oscillator) 33, a multiplier 34, and a frequency divider 35. The phase comparator 31 detects a phase difference of 1PPS(Re) from the GPS receiver 2 and 1PPS(Lo) corresponding to a synchronizing signal of the present invention from the frequency divider 35, and generates and outputs a phase difference signal of a voltage level based on the phase difference. The loop filter 32 includes, for example, a low pass filter, and it averages the voltage levels of the phase difference signals on a time axis and generates a drive voltage signal to output it to the VCO 33. The VCO 33 generates a reference signal Sout of a frequency (for example, 10 MHz) based on the drive voltage signal, and outputs it externally and gives it to the multiplier 34. The multiplier 34 multiplies the reference signal Sout to generate a clock signal CLK (for example, about 100 MHz). The frequency divider 35 divides the clock signal into frequencies to generate 1PPS(Lo), and gives it to the phase comparator 31. By using such a configuration, the reference signal Sout and the clock signal CLK which are outputted from the reference signal generating device 3 turn into signals synchronized with 1PPS(Re) from the GPS receiver 2 with high precision. Note that, the multiplier 34 may also be omitted according to the frequency of the reference signal Sout generated by the VCO 33.

The phase measuring device 1 includes a digital measuring subsystem 11 and a phase difference calculator 12. The digital measuring subsystem 11 includes a buffer delay measuring circuit 110 and a phase difference measuring circuit 120.

The buffer delay measuring circuit 110 is inputted with the clock signal CLK from the reference signal generating device 3, and a sampling reference signal SCL which is obtained by frequency-dividing the GPS is reference signal Ref(GPS) of the GPS receiver 2 by using the frequency divider 40. Here, the sampling reference signal SCL includes a signal having a sufficiently long cycle (low frequency) rather than that of the clock signal. Although described later in details, the buffer delay measuring circuit 110 includes TDCs, and uses the clock signal CLK and the sampling reference signal SCL to generate a delay measurement data Ds for measuring a delay amount $\tau_B$ between the clock signals given to each of buffers of the TDCs, and gives it to the phase difference calculator 12.

The phase difference measuring circuit 120 is inputted with the clock signal CLK, and the first measuring signal SS(A) and the second measuring signal SS(B) which cause a phase difference therebetween to be measured. Although described later in details together with the buffer delay measuring circuit 110, the phase difference measuring circuit 120 generates coarse phase amount data Dt indicating a quantity of resolution representing a cycle of the clock signals in the phase difference between the first measuring signal SS(A) and the second measuring signal SS(B). Moreover, the phase difference measuring circuit 120 has a structure in which the first measuring signal SS(A) and the second measuring signal SS(B) are assigned with one TDC, respectively. The phase difference measuring circuit 120 uses the clock signal CLK and the first measuring signal SS(A) or the second measuring signal SS(B) to generate phase difference measurement data Ds(A) or Ds(B) indicating a fraction phase difference which is shorter than the cycle of the clock signal, which cannot be expressed with the coarse phase amount data Dt, and outputs it to the phase difference calculator 12.

The phase difference calculator 12 includes a processor, and calculates the delay amount $\tau_B$ between the buffers from the delay measurement data Ds. The phase difference calculator 12 calculates a coarse phase difference based on the cycle of the clock signal and the coarse phase amount data Dt, and calculates the fraction phase difference based on the calculated delay amount $\tau_B$ and the phase difference measurement data Ds(A) or Ds(B). The phase difference calculator 12 calculates a phase difference between the first measuring signal SS(A) and the second measuring signal SS(B) based on the coarse phase difference Dt and the fraction phase difference.

Next, the configuration and principle of the phase measuring device 1 are described more specifically.

Figure 2:
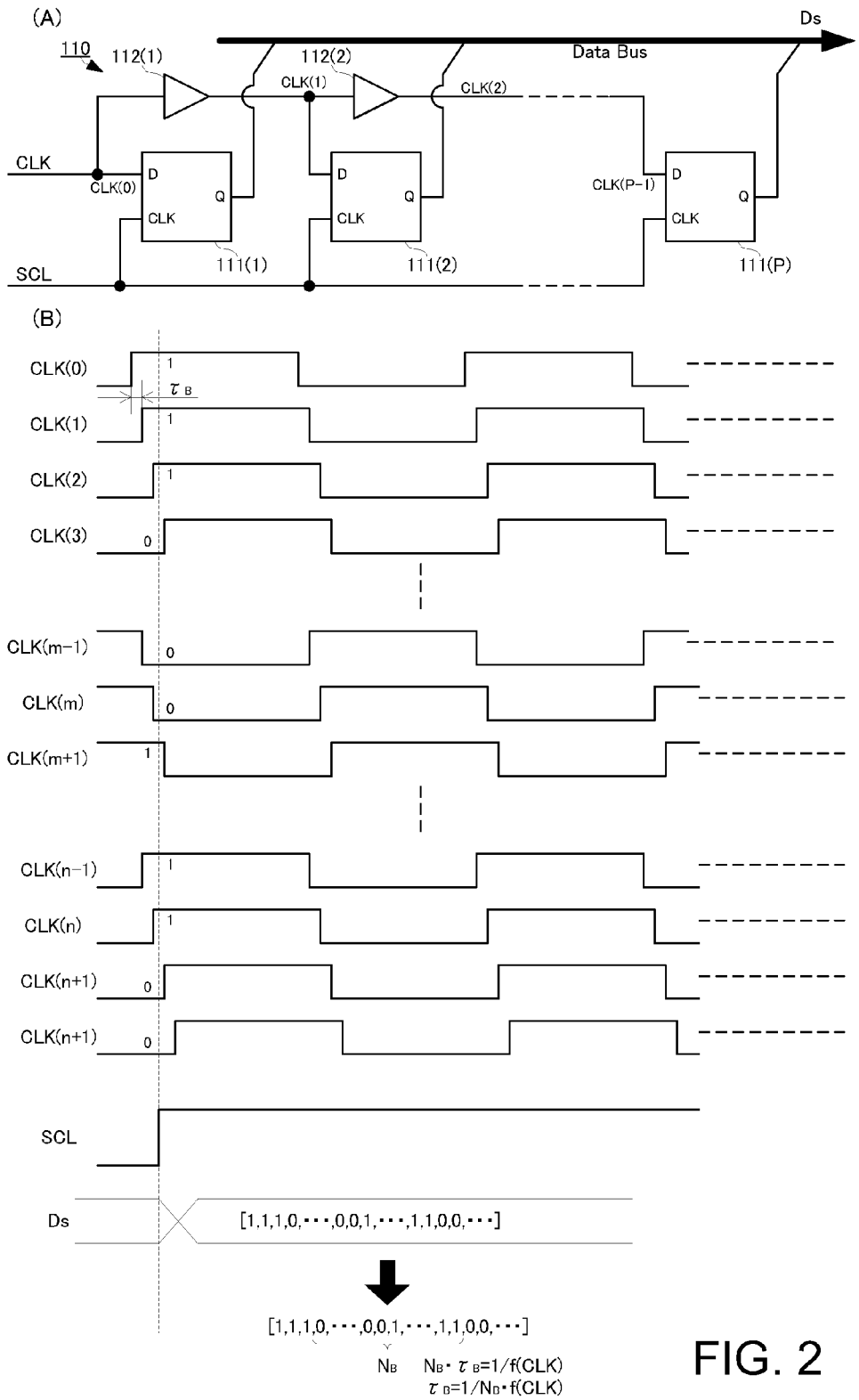
FIG. 2 is a block diagram showing a primary configuration of a buffer delay measuring circuit 110 of the phase measuring device 1, and a timing chart showing a measurement principle of the buffer delay measuring circuit 110.

First, a detection of the delay amount $\tau_B$ between the buffers is described. FIG. 2(A) is a block diagram showing a primary configuration of the buffer delay measuring circuit 110 of the phase measuring device 1, and FIG. 2(B) is a timing chart showing a measurement principle of the buffer delay measuring circuit 110.

The buffer delay measuring circuit 110 is comprised of TDCs, and includes two or more buffer circuits 111(1) to 111(P) which constitute a predetermined number of stages. Each of the buffer circuits 111(1) to 111(P) has a D-input terminal, a CLK-input terminal, and a Q-output terminal. The Q-output terminal of each of the buffer circuits 111(1) to 111(P) is connected with a data bus, and the data bus is connected with the phase difference calculator 12. The CLK-input terminal of each of the buffer circuits 111(1) to 111(P) is inputted with the sampling reference signal SCL. The D-input terminal of each of the buffer circuits 111(1) to 111(P) is inputted with clock signals CLK(0) to CLK(P−1), respectively, based on the clock signal CLK from the reference signal generating device 3. Specifically, the clock signal CLK(0) inputted into the buffer circuit 111(1) is the clock signal CLK itself from the reference signal generating device 3, and the clock signal CLK(1) inputted into the buffer circuit 111(2) is a signal which is obtained by delaying the clock signal CLK by the delay amount $\tau_B$ in a delay device 112(1). Furthermore, the clock signal CLK(2) inputted into the buffer circuit 111(3) (not illustrated) is a signal which is obtained by further delaying the clock signal CLK(1) by the delay amount $\tau_B$ in a delay device 112(2). Thus, to each of the buffer circuits 111(1) to 111(P), the clock signals CLK(0) to CLK(P−1) each having a sequentially accumulated delay interval by the delay amounts $\tau_B$ are inputted, respectively.

In a state where the respective clock signals CLK(0) to CLK(P−1) and the sampling reference signal SCL are inputted into the respective buffer circuits 111(1) to 111(P), when a level transition of the sampling reference signal SCL occurs, the buffer circuits 111(1) to 111(P) latch the levels of the clock signals CLK(0) to CLK(P−1) at a level transition timing (a timing at which the sampling reference signal SCL in FIG. 2(B) transitions from "0" to "1"), and output state data indicating "1" or "0," respectively. For example, in the example of FIG. 2(B), since the clock signal CLK(0) has the level of "1" at the level transition timing of the sampling reference signal SCL, the buffer circuit 111(1) outputs the state data of "1." Similarly, the buffer circuits 111(2) and 111(3) output the state data of "1." Moreover, the buffer circuit 111(4) outputs the state data of "0" since the clock signal CLK(3) has the level of "0" at the level transition timing of the sampling reference signal SCL. Thus, a group of the state data comprised of "1" and "0" which are outputted from the buffer circuits 111(1) to 111(P) are outputted to the phase difference calculator 12, as the delay measurement data Ds (refer to FIG. 2(B)) where the data on the buffer circuit 111(1) side are set to MSB and the data on the buffer circuit 111(P) side are set to LSB.

Here, the number of state data $N_B$ contained between the state transition timing in a specific direction of the delay measurement data Ds (for example, the timing at which the state data transitions from "1" to "0") is determined according to a frequency "f" of the clock signal CLK and the delay amount $\tau_B$ which is given to between the above buffer circuits, and it has a relation of $N_B \cdot \tau_B = 1/f$. Here, since the clock signal CLK synchronizes with 1PPS(Re) from the GPS receiver 2 and its long-term stability is $1 \times 10^{-12}$, the clock signal CLK is also highly precise. Therefore, the delay amount $\tau_B$ can be calculated with high precision from an equation of $\tau_B = 1/(N_B \cdot f)$ by measuring the number of state data $N_B$.

Furthermore, the phase difference calculator 12 can calculate the highly precise delay amount $\tau_B$ by acquiring the numbers of state data $N_B$ from the delay measurement data Ds for two or more times and averaging the numbers of state data as shown in Equation (1).

$$\tau_B = \frac{1}{f \cdot \sum_{i=0}^{k} N_B(i)} \quad (1)$$

Note that, although the averaging is performed in this description, a least-square method or a digital filter may also be used.

Figure 3:
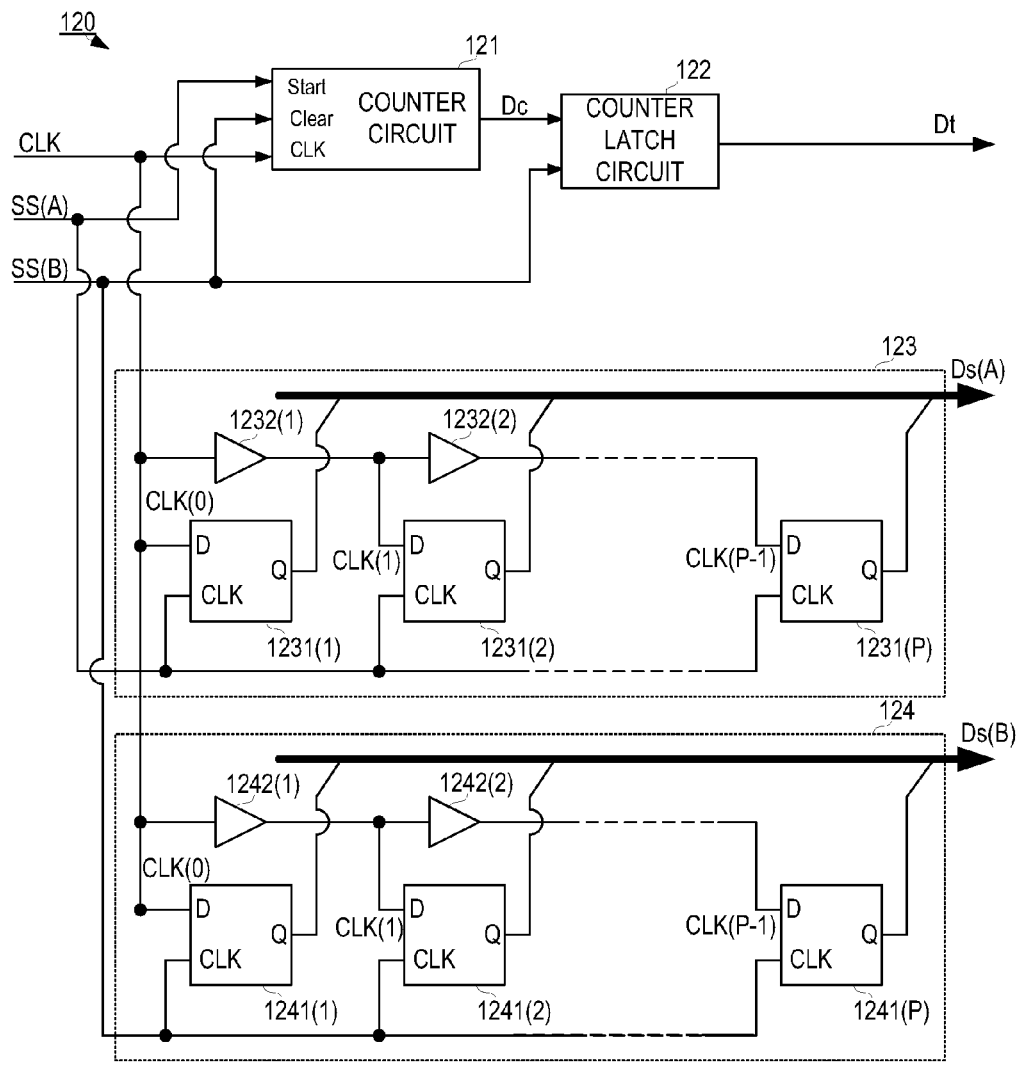
FIG. 3 is a block diagram showing a circuit configuration of a phase difference measuring circuit 120.
Figure 4:
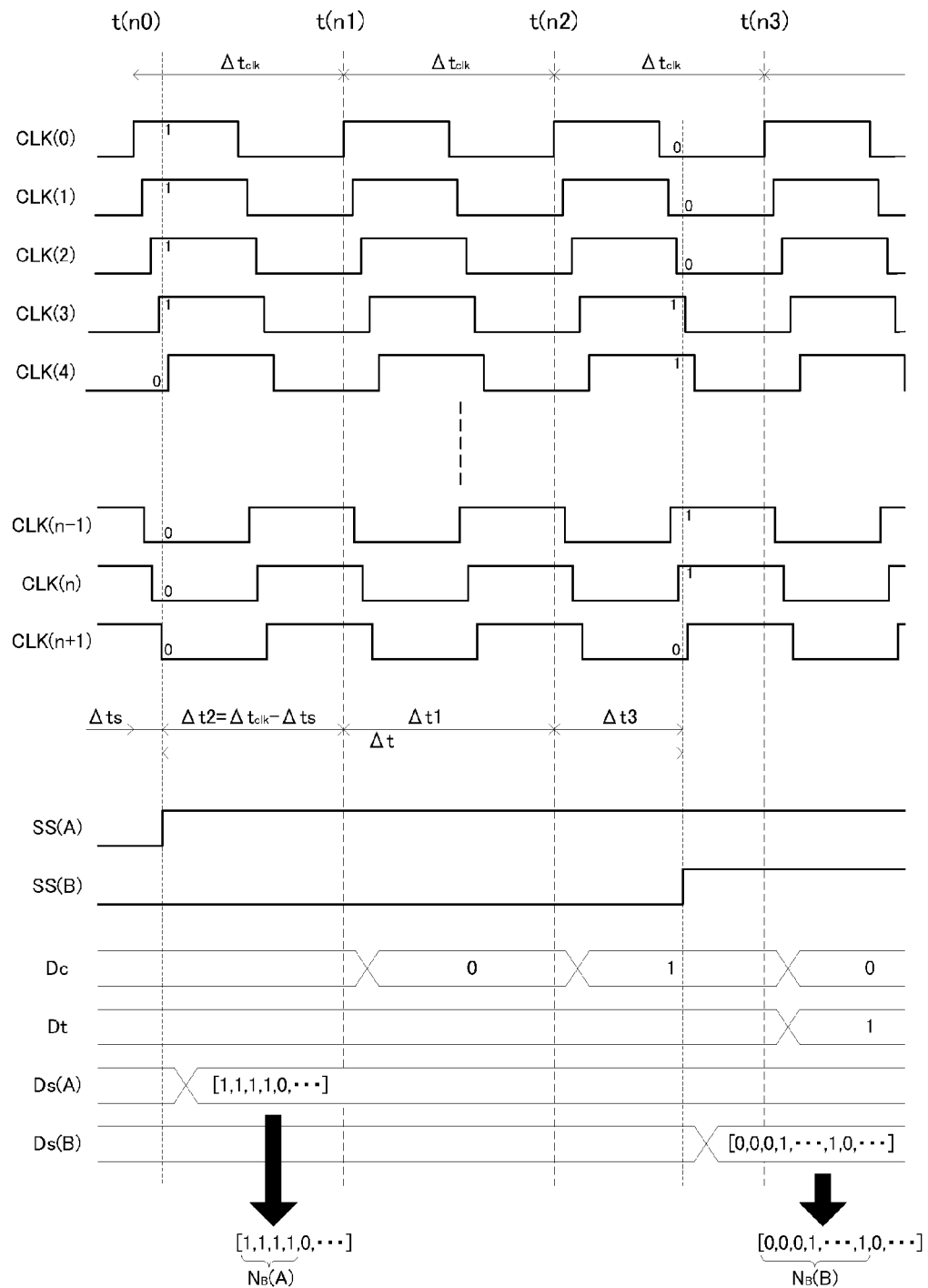
FIG. 4 is a timing chart showing a phase difference measurement principle.

Next, a detection of the phase difference between the measuring signal SS(A) and the measuring signal SS(B) is described. FIG. 3 is a block diagram showing a circuit configuration of the phase difference measuring circuit 120, and FIG. 4 is a timing chart showing a phase difference measurement principle.

The phase difference measuring circuit 120 includes a counter circuit 121, a counter latch circuit 122, a first partial phase difference measuring circuit 123, and a second partial phase difference measuring circuit 124. Here, a combination circuit comprised of the counter circuit 121 and the counter latch circuit 122 corresponds to a third phase difference measuring circuit of the present invention.

the counter circuit 121 is inputted with the clock signal CLK, the first measuring signal SS(A), and the second measuring signal SS(B). the counter circuit 121 acquires, where a transition timing of the first measuring signal SS(A) is set to a start flag while a transition timing of the second measuring signal SS(B) is set to a clear flag, a count value Dc from the start flag to the clear flag, and outputs it to the counter latch circuit 122. The counter circuit 121 clears the count value after the output to the counter latch circuit 122. For example, like the example of FIG. 4, when the transition timing of the first measuring signal SS(A) occurs between a timing t(n1) and a timing t(n1) of the clock signal CLK (i.e., CLK(0)), and when the transition timing of the second measuring signal SS(B) occurs between a timing t(n2) and a timing t(n3), Dc=0 is outputted for one clock signal having one cycle from the timing t(n0) at the timing t(n1), Dc=1 is outputted for one clock signal having one cycle from the timing t(n1) at the timing t(n2), and Dc=0 is outputted for one clock signal having one cycle from the timing t(n2) at the timing t(n3).

The counter latch circuit 122 is inputted with the count value Dc and the second measuring signal SS(B). The counter latch circuit 122 latches the count value Dc inputted from the counter circuit 121 until it detects the transition timing of the second measuring signal SS(B), and when the transition timing is detected, it outputs the latched count value Dt to the phase difference calculator 12.

The first partial phase difference measuring circuit 123 and the second partial phase difference measuring circuit 124 are comprised of a TDC, respectively, and are comprised of the same number of buffer circuits.

The first partial phase difference measuring circuit 123 includes buffer circuits 1231(1) to 1231(P) which constitute a plurality of stages. Each of the buffer circuits 1231(1) to 1231(P) includes a D-input terminal, a CLK-input terminal, and a Q-output terminal. The Q-output terminal of each of the buffer circuits 1231(1) to 1231(P) is connected with a data bus, and the data bus is connected with the phase difference calculator 12. The CLK-input terminal of each of the buffer circuits 1231(1) to 1231(P) is inputted with the first measuring signal SS(A). The D-input terminal of each of the buffer circuits 1231(1) to 1231(P) is inputted with the clock signals CLK(0) to CLK(P−1), respectively, based on the clock signal CLK from the reference signal generating device 3, similar to the buffer delay measuring circuit 110. Specifically, the clock signal CLK(0) inputted into the buffer circuit 1231(1) is the clock signal CLK itself from the reference signal generating device 3, and the clock signal CLK(1) inputted into the buffer circuit 1231(2) is a signal which is obtained by delaying the clock signal CLK by the delay amount $\tau_B$ in a delay device 1232(1). Furthermore, the clock signal CLK(2) inputted into the buffer circuit 1231(3) (not illustrated) is a signal which is obtained by further delaying the clock signal CLK(1) by the delay amount $\tau_B$ in a delay device 1232(2). Thus, to each of the buffer circuits 1231(1) to 1231(P), the clock signals CLK (0) to CLK(P−1) each having a sequentially accumulated delay interval of the delay amount $\tau_B$ are inputted, respectively.

In a state where each of the clock signals CLK(0) to CLK (P−1) and the first measuring signal SS(A) are inputted into the respective buffer circuits 1231(1) to 1231(P), when the level transition of the first measuring signal SS(A) occurs, each of the buffer circuits 1231(1) to 1231(P) latches the levels of the respective clock signals CLK(0) to CLK(P−1), at the level transition timing (in FIG. 4, at a timing where the first measuring signal SS(A) transitions from "0" to "1"), and output the state data of "1" or "0." In the example of FIG. 4, the buffer circuit 1231(1) outputs the state data of "1" since the clock signal CLK(0) has the level of "1" at the level transition timing of the first measuring signal SS(A). Similarly, the buffer circuits 1231(2), 1231(3), and 1231(4) output the state data of "1." Moreover, the buffer circuit 1231(5) outputs the state data of "0" since the clock signal CLK(4) has the level of "0" at the level transition timing of the first measuring signal SS(A). Thus, a group of the state data each comprised of "1" and "0" outputted from the respective buffer circuits 1231(1) to 1231(P) is outputted to the phase difference calculator 12 as the first phase difference measurement data Ds(A) where the data on the buffer circuit 1231(1) side are set to MSB, while the data on the buffer circuit 1231(P) side are set to LSB, and (refer to FIG. 4).

The second partial phase difference measuring circuit 124 includes the buffer circuits 1241(1) to 1241(P) which constitute a plurality of stages. Each of the buffer circuits 1241(1) to 1241(P) includes a D-input terminal, a CLK-input terminal, and a Q-output terminal. The Q-output terminal of each of the buffer circuits 1241(1) to 1241(P) is connected with a data bus, and the data bus is connected with the phase difference calculator 12. The CLK-input terminal of each of the buffer circuits 1241(1) to 1241(P) is inputted with the second measuring signal SS(B). The D-input terminal of each of the buffer circuits 1241(1) to 1241(P) are inputted with the respective clock signals CLK (0) to CLK(P−1) based on the clock signal CLK from the reference signal generating device 3, like the buffer delay measuring circuit 110. Specifically, the clock signal CLK(0) inputted into the buffer circuit 1241(1) is the clock signal CLK itself from the reference signal generating device 3, and the clock signal CLK(1) inputted into the buffer circuit 1241(2) is a signal which is obtained by delaying the clock signal CLK by the predetermined delay amount $\tau_B$ in a delay device 1242(1). Furthermore, the clock signal CLK(2) inputted into the buffer circuit 1241(3) (not illustrated) is a signal which is obtained by further delaying the clock signal CLK(1) by the delay amount $\tau_B$ in a delay device 1242(2). Thus, to each of the buffer circuits 1241(1) to 1241 (P), the respective clock signals CLK(0) to CLK(P−1) each having a sequentially accumulated delay interval of the delay amount $\tau_B$ are inputted.

In a state where each of the clock signals CLK(0) to CLK (P−1) and the second measuring signal SS(B) are inputted into the respective buffer circuits 1241(1) to 1241(P), when a level transition of the second measuring signal SS(B) occurs, each of the buffer circuits 1241(1) to 1241(P) latches the levels of the respective clock signals CLK(0) to CLK(P−1) at the level transition timing (in FIG. 4, a timing at which the second measuring signal SS(B) transitions from "0" to "1"), and outputs the state data of "1" or "0." For example of FIG. 4, the buffer circuit 1241(1) outputs the state data of "0" since the clock signal CLK(0) has the level of "0" at the level transition timing of the second measuring signal SS(B). Similarly, the buffer circuits 1241(2) and 1241(3) output the state data of "0." Moreover, the buffer circuit 1241(4) outputs the state data of "1" since the clock signal CLK(3) has the level of "1" at the level transition timing of the second measuring signal SS(B). Thus, a group of the state data comprised of "1" and "0" outputted from the buffer circuits 1241(1) to 1241(P) is outputted to the phase difference calculator 12, as the second phase difference measurement data Ds(B) (refer to FIG. 4) where the data on the buffer circuit 1241(1) side are set to MSB, and the data on the buffer circuit 1241(P) side are set to LSB.

Here, the number of state data $N_B(A)$ from the first state data in the first phase difference measurement data Ds(A) up to a timing at which the state data transitions from "1" to "0" is determined according to a lapsed time from the start timing of the clock signal CLK (i.e., CLK(0)) immediately before the transition timing of the first measuring signal SS(A) up to the transition timing of the first measuring signal SS(A), and the delay amount $\tau_B$ between the buffer circuits. Therefore, the lapsed time ($\Delta ts$ in FIG. 4) up to the transition timing of the first measuring signal SS(A) can be calculated by $N_B(A) \cdot \tau_B$.

Similarly, the number of state data $N_B(B)$ from the first state data up to the state data of the transition timing from "1" to "0" in the second phase difference measurement data Ds(B) is determined according to a lapsed time from the start timing of the clock signal CLK (i.e., CLK(0)) immediately before the transition timing of the second measuring signal SS(B) up to the transition timing of the second measuring signal SS(B), and the delay amount $\tau_B$ between the buffer circuits. Therefore, the lapsed time ($\Delta t3$ in FIG. 4) up to the transition timing of the second measuring signal SS(B) can be calculated by $N_B(B) \cdot \tau_B$.

The phase difference calculator 12 calculates a coarse phase difference $\Delta t1$ having a resolution of one cycle ($\Delta t_{clk}$) of the clock signal CLK based on the number data row Dt. For example, in the example of FIG. 4, since the coarse phase difference $\Delta t1$ corresponds to a time length of the cycle of the clock signal CLK1 alone, it is calculated by $\Delta t1 = \Delta t_{clk} = 1/f$, where the frequency of the clock signal CLK is set to "f."

When the phase difference calculator 12 acquires the number of state data $N_B(A)$ from the first phase difference measurement data Ds(A), it then calculates a front-side fraction phase difference $\Delta t2$ which is a fraction on the front-side of the coarse phase difference $\Delta t1$ in time. Here, the front-side fraction phase difference $\Delta t2$ is a time length from the transition timing of the first measuring signal SS(A) up to the start timing of the cycle of the clock signal CLK detected with the coarse phase difference $\Delta t1$ (i.e., an end timing of the immediately previous clock signal). Therefore, it can be obtained by subtracting the time length from the start timing of the clock signal CLK up to the start timing of the first measuring signal SS(A), from the time length for one cycle of the clock signal CLK (refer to FIG. 4).

Utilizing this, the phase difference calculator 12 multiplies the delay amount $\tau_B$ calculated as described above based on the output of the buffer delay measuring circuit 110 by the number of state data $N_B(A)$ to calculate the difference value Ms ($=N_B(A)\cdot\tau_B$), and then subtracts it from the time length $\Delta t_{clk}$ for one cycle of the clock signal CLK. That is, the phase difference calculator 12 performs the calculation by using an equation of the front-side fraction phase difference $\Delta t2=\Delta t_{clk}-\Delta ts=\Delta t_{clk}-N_B(A)\cdot\tau_B$.

On the other hand, when the phase difference calculator 12 acquires the number of state data $N_B(B)$ from the second phase difference measurement data Ds(B), it then calculates a rear-side fraction phase difference $\Delta t3$ which is a fraction on the rear side in time of the coarse phase difference $\Delta t1$. Here, the rear-side fraction phase difference $\Delta t3$ is a time length from an end timing of the cycle of the clock signal CLK detected with the coarse phase difference $\Delta t1$ (i.e., a start timing of the immediately-later clock signal) up to the transition timing of the second measuring signal SS(A). Therefore, it can be obtained by multiplying the delay amount $\tau_B$ by the number of state data $N_B(B)$ (refer to FIG. 4).

Utilizing this, the phase difference calculator 12 multiplies the delay amount $\tau_B$ by the number of state data $N_B(B)$ to calculate the rear-side fraction phase difference $\Delta t3$ ($=N_B(B)\cdot\tau_B$).

The phase difference calculator 12 adds the coarse phase difference $\Delta t1$, the front-side fraction phase difference $\Delta t2$, and the rear-side fraction phase difference $\Delta t3$, which are calculated as above, to calculate a phase difference $\Delta t$ ($=\Delta t2+\Delta t1+\Delta t3$) between the first measuring signal SS(A) and the second measuring signal SS(B), and then outputs it as a phase difference data PD.

By using the above configuration, since the clock signal is maintained with high precision synchronizing with 1PPS(Re) of GPS, the delay amount between the buffers can be set with high precision, and the phase difference can be measured with high precision including the fraction phase differences which are less than one cycle of the clock signal CLK, only using the digital circuit, without the analog circuitry elements.

Furthermore, in the configuration described above, the phase difference calculator 12 acquires and stores the number of state data $N_B(A)$ and $N_B(B)$ two or more times similar to the number of state data $N_B$, calculates the average value as stated in Equation (1), and, after that, it calculates the phase difference $\Delta t$. By such averaging of the number of state data, the phase difference can be calculated with higher precision. Moreover, also regarding the delay amount $\tau_B$ which is used in the calculation, if the averaged result as described above is used, the phase difference can be calculated still with even higher precision.

Note that, the circuit configuration of the buffer delay measuring circuit and the phase difference measuring circuit described above is an example, and, for example, it may be a configuration where a delay device is installed on the CLK-input side of each buffer circuit, and input signals are interchanged.

Figure 5:
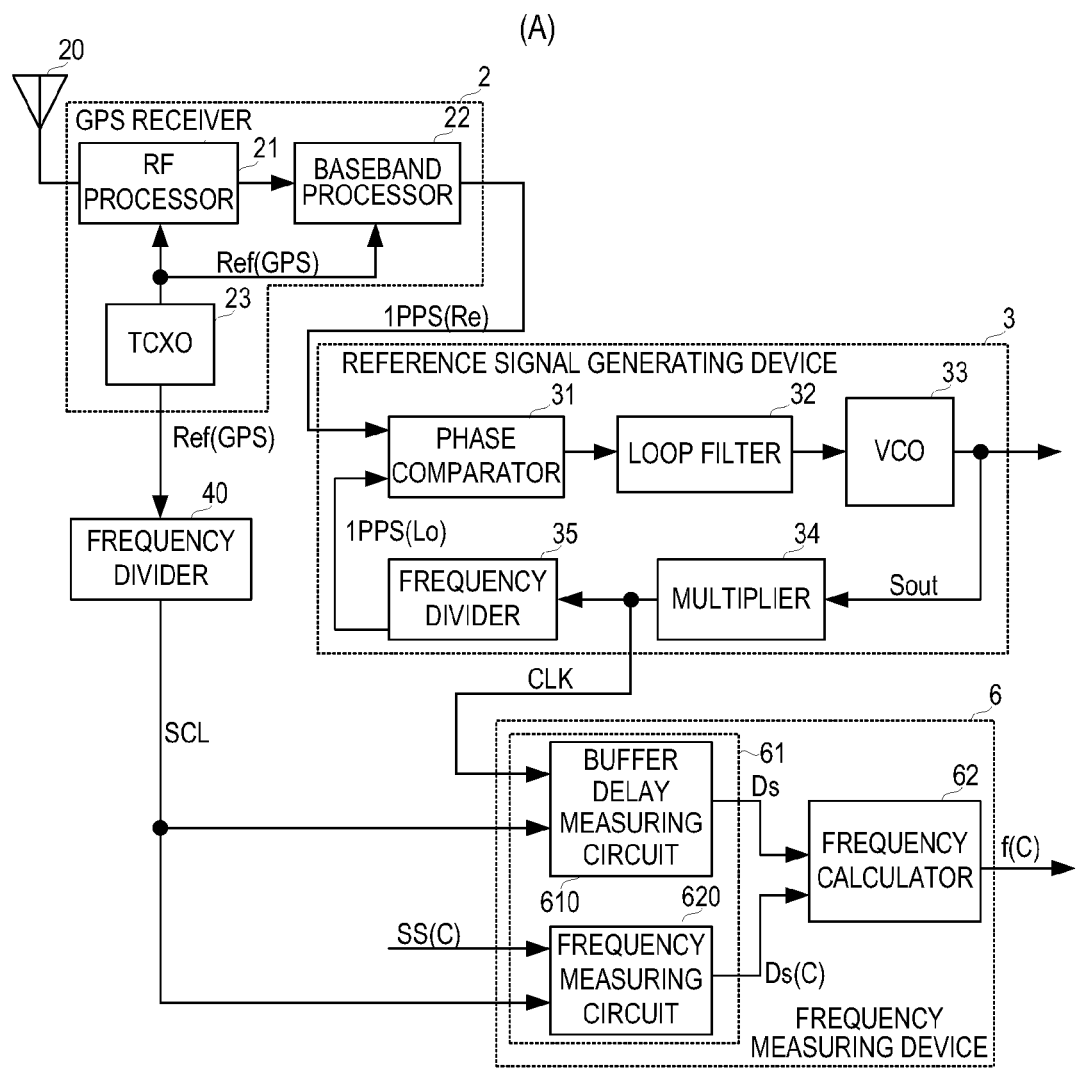
FIG. 5 is a block diagram showing a primary configuration of a second frequency measuring device and each device that gives various kinds of signals to the frequency measuring device, and a view showing another example of the frequency measuring device configuration.
Figure 5:
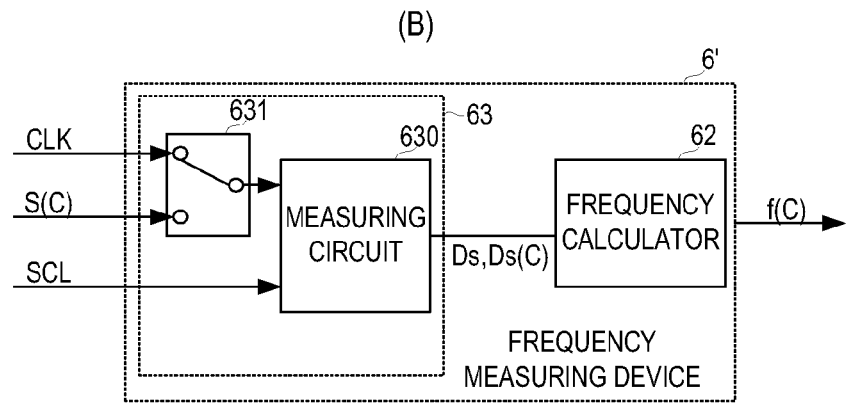

Next, a frequency measuring device according to a second embodiment is described with reference to the accompanying drawings. FIG. 5(A) is a block diagram showing a primary configuration of a frequency measuring device and each device which gives various kinds of signals to the frequency measuring device. FIG. 5(B) is a view showing another example configuration of the frequency measuring device. Note that, the GPS receiver 2 and the reference signal generating device 1 which are shown in this embodiment are the same as what are shown in the first embodiment and, thus the description thereof will be omitted.

The frequency measuring device 6 includes a digital measuring subsystem 61 and a frequency calculator 62. The digital measuring subsystem 61 includes a buffer delay measuring circuit 610 and a frequency measuring circuit 620. The buffer delay measuring circuit 610 has the same configuration as the buffer delay measuring circuit 110 shown in the first embodiment, and gives the delay measurement data Ds relating to the delay amount $\tau_B$ between the buffers to the frequency calculator 62.

The internal circuit configuration of the frequency measuring circuit 620 is the same as the buffer delay measuring circuits 110 and 610, but is only different in kinds of the signals inputted, and the frequency measuring circuit 620 is inputted with the measuring signal SS(C) and the sampling reference signal SCL. Under the present circumstances, the measuring signal SS(C) is inputted into the frequency measuring circuit 620, instead of the clock signal CLK of the buffer delay measuring circuit 610. By this configuration, the to frequency measuring circuit 620 gives to the frequency calculator 62, the frequency measurement data Ds(C) comprised of a data array of the "1" and "0" similar to the delay measurement data Ds.

By having such a configuration, the number of state data $N_B(C)$ contained between the state transition timing in a specific direction (for example, a timing at which the state data transitions from "1" to "0"), of the frequency measurement data Ds(C) outputted from the frequency measuring circuit 620 is determined, like the description of the buffer delay measuring circuit 110, according to the frequency "f" of the measuring signal SS(C) and the delay amount $\tau_B$ given between the buffer circuits, and it has a relation of $N_B(C)\cdot\tau_B=1/f(c)$.

Utilizing this relation, the frequency calculator 62 measures the number of state data $N_B$ of the delay measurement data Ds from the buffer delay measuring circuit 610 to calculate the delay amount $\tau_B$, and from the equation of $f(C)=1/(N_B(C)\cdot\tau_B)$, the frequency f(C) of the measuring signal SS(C) can be calculated. Under the present circumstances, since the delay amount $\tau_B$ can be calculated with high precision as described above, the frequency f(C) of the measuring signal SS(C) can also be calculated with high precision. Thereby, the highly precise frequency measurement can be performed only with the digital circuit, without using any analog circuitry.

Note that, in this embodiment, although the example where the buffer delay measuring circuit 610 and the frequency measuring circuit 620 which are individually provided with the same types of TDCs are shown, the measuring circuit 630 comprised of a single TDC can also perform the frequency measurement as shown in FIG. 5(B). In this case, an input signal circuit 631 for switching between the clock signal CLK and the measuring signal SS(C) by digital processing may be provided in the front stage of the measuring circuit 630. By having such a configuration, the number of TDCs can be further reduced, and the frequency measuring device can be achieved more simply.

DESCRIPTION OF NUMERICAL NUMBERS

1: Phase Measuring Device; 11, 61: Digital Measuring Subsystem, 110, 610: Buffer Delay Measuring Circuit; 120: Phase Difference Measuring Circuit; 12: Phase Difference Calculator; 2: GPS Receiver; 20: GPS Antenna; 21: RF Processor; 22: Baseband Processor; 23: TCXO; 3: Reference Signal Generating Device; 31: Phase Comparator; 32: Loop Filter; 33: VCO; 34: Multiplier; 35, 40: Frequency Divider; 62: Frequency Calculator; 111, 1231, 1241: Buffer Circuit; 112, 1232, 1242: Delay Circuit; 121: Counter Circuit; 122: Counter Latch Circuitry; and 620: Frequency Measuring Subsystem

What is claimed is:

1. A phase measuring device, comprising:
a buffer delay amount measuring circuit, including a plurality of buffers for being inputted with clock signals, that are synchronized with a reference signal calculated by positioning calculation, at different timings shifted by a fixed delay time, respectively, and being simultaneously inputted with a sampling reference signal of a lower frequency than the clock signals, and for respectively generating state data according to levels of the clock signals at a transition timing of the sampling reference signal, wherein the buffer delay amount measuring circuit outputs delay measurement data comprised of a group of the state data from the plurality of buffers;
a phase difference measuring circuit including a first partial phase difference measuring circuit and a second partial phase difference measuring circuit,
wherein the first partial phase difference measuring circuit includes a plurality of buffers for being inputted with a first measuring signal among the first measuring signal and a second measuring signal that produce a phase difference therebetween to be measured, being inputted with the clock signals at mutually different timings by the delay amount, and respectively generating state data according to the levels of the clock signals at a transition timing of the first measuring signal, and wherein the first partial phase difference measuring circuit outputs first phase difference measurement data comprised of a group of state data from the plurality of buffers, and
wherein the second partial phase difference measuring circuit includes a plurality of buffers for being inputted with the second measuring signal, being inputted with the clock signals at mutually different timings by the delay amount, and respectively generating state data according to the levels of the clock signals at a transition timing of the second measuring signal, and wherein the second phase difference measurement circuit outputs second phase difference measurement data comprised of a group of the state data from the plurality of buffers; and
a phase difference calculator for calculating the delay amount between the buffers based on the delay measurement data, and calculating the phase difference based on a difference value of the transition timings and the delay amounts of the clock signals of the first phase difference measurement data and the second phase difference measurement data.

2. The phase measuring device of claim 1, wherein the phase difference measuring circuit includes a third partial phase difference measuring circuit for giving a start timing and an end timing of measuring the number of clock signals per one cycle as a first measuring signal and a second measuring signal, respectively, to calculate the number of clock signals per one cycle contained within the phase difference, and
wherein the phase difference calculator calculates the phase difference also containing a time length according to the number of clock signals per one cycle.

3. A frequency measuring device, comprising:
a buffer delay amount measuring circuit including a plurality of buffers for being inputted with clock signals, that are synchronized with a reference signal calculated by positioning calculation, at different timings shifted by a fixed delay time, respectively, and being simultaneously inputted with a sampling reference signal of a lower frequency than the clock signals, and respectively generating state data according to levels of the clock signals at a transition timing of the sampling reference signal, wherein the buffer delay amount measuring circuit outputs delay measurement data comprised of a group of the state data from the plurality of buffers;
a frequency measuring circuit including a plurality of buffers for being inputted with measuring signals at different timings shifted by a fixed delay time, respectively, being simultaneously inputted with a sampling reference signal of a lower frequency than the measuring signals, and respectively generating state data according to levels of the measuring signals at a transition timing of the sampling reference signal, wherein the frequency measuring circuit outputs the frequency measurement data comprised of a group of the state data from the plurality of buffers; and
a frequency calculator for calculating the delay amount between the buffers based on the delay measurement data, and calculating a frequency or a cycle of the measuring signals based on the frequency measurement data and the delay amount.

4. A frequency measuring device, comprising:
a measuring circuit including a plurality of buffers for being inputted with either one of clock signals and measuring signals, that are synchronized with a reference signal calculated by positioning calculation, at different timings shifted by a fixed delay time, respectively, being simultaneously inputted with a sampling reference signal of a lower frequency than the clock signals and the measuring signals, and respectively generating state data according to levels of the clock signals or the measuring signals at a transition timing of the sampling reference signal, wherein the measuring circuit outputs delay measurement data comprised of a group of the state data from the plurality of buffers when the clock signals are inputted, and outputs frequency measurement data comprised of a group of the state data from the plurality of buffers when the measuring signals are inputted; and
a frequency calculator for calculating the delay amount between the buffers based on the delay measurement data, and calculating a frequency or a cycle of the measuring signals based on the frequency measurement data and the delay amount.

* * * * *